United States Patent [19]
Tsang et al.

[11] Patent Number: 5,243,604
[45] Date of Patent: Sep. 7, 1993

[54] ON-THE-FLY ERROR CORRECTION

[75] Inventors: Kinhing P. Tsang, Plymouth; Bruce E. Johnson, Minnetonka, both of Minn.

[73] Assignee: Seagate Technology, Inc., Scotts Valley, Calif.

[21] Appl. No.: 629,398

[22] Filed: Dec. 18, 1990

[51] Int. Cl.⁵ .......................................... H03M 13/00
[52] U.S. Cl. ................... 371/40.1; 371/40.2
[58] Field of Search ............... 371/40.1, 41, 39.1, 371/40.2, 38.1, 37.2

[56] References Cited

U.S. PATENT DOCUMENTS

| | | | |
|---|---|---|---|
| 4,151,510 | 4/1979 | Howell et al. | 340/146.1 |
| 4,236,247 | 11/1980 | Sundberg | 371/40.1 |
| 4,397,022 | 8/1983 | Weng et al. | 371/37 |
| 4,567,594 | 1/1986 | Deodhar | 371/40.1 |
| 4,569,051 | 2/1986 | Wilkinson | 371/37 |
| 4,633,471 | 12/1986 | Perera et al. | 371/40.1 |
| 4,890,287 | 12/1989 | Johnson et al. | 371/37 |
| 4,961,193 | 10/1990 | Debord et al. | 371/40.1 |

FOREIGN PATENT DOCUMENTS 0204576 12/1986 European Pat. Off. .
0218413 4/1987 European Pat. Off. .
0240921 10/1987 European Pat. Off. .

Primary Examiner—Robert W. Beausoliel, Jr.
Assistant Examiner—Trinh Tu
Attorney, Agent, or Firm—Kinney & Lange

[57] ABSTRACT

On-the-fly error correction is provided using syndromes of a codeword encoded on data storage media. First and second syndromes are generated and a variable prescaler prescales the second syndrome by a field element to produce a prescaled second syndrome where the field element is variable. The error value is determined based on the first syndrome, and the error location is determined based on a comparison between the error value and the value of the prescaled second syndrome. The error value located at the error location is then corrected.

12 Claims, 3 Drawing Sheets

ON-THE-FLY ERROR CORRECTION

INCORPORATION BY REFERENCE

The following patent is hereby fully incorporated by reference: ON-THE-FLY ERROR CORRECTION U.S. Pat. No. 4,890,287 issued Dec. 26, 1989 having common inventors and a common assignee with the present invention.

BACKGROUND OF THE INVENTION

The present invention relates to error correction used with data storage devices. More particularly, the present invention relates to on-the-fly error correction for magnetic recording media such as magnetic disc drives.

Until recently, "on-the-fly" error correction has not been widely incorporated into high speed magnetic recording devices for several reasons. It is difficult to develop high code correction capacity and high error detection capacity in an on-the-fly correction system. Therefore, such systems have had reliability problems. Also, the mathematics involved in error correction in such systems has typically been extremely complex. The extreme complexity, itself, poses certain problems. Also, this complexity typically results in high latency within the error correction system. When the error detection capacity and the error correction capacity of the code are increased, the latency and complexity of the system are simultaneously increased. All of these problems compound one another.

In conventional error correction systems, each codeword to be decoded and corrected typically comprises a complete sector on a magnetic disc. Each codeword should be decoded and corrected prior to reading the next codeword. However, where correction takes a long time relative to the reading operation performed by the read head in the disc drive, the next subsequent codeword to be read and decoded could pass a disc drive's read head before the previous codeword had been decoded and corrected. Thus, in order to decode and correct the next subsequent codeword, the system was required to wait one entire disc revolution until the next subsequent codeword was again under the read head in the disc drive. Therefore, on-the-fly error correction is desirable. Two prior art references, U.S. Pat. Nos. 4,494,234 and 4,504,948, both to Patel, disclose multibyte, on-the-fly error correction systems. However, the hardware required to implement these systems is extremely complex, employing hundreds if not thousands of exclusive-OR ("XOR") gates.

REFERENCE TO INCORPORATED PATENT

The reference entitled ON-THE-FLY ERROR CORRECTION, U.S. Pat. No. 4,890,287, which is incorporated by reference above, discloses an on-the-fly error correction system which overcomes many of the problems associated with prior techniques and prior attempts to provide on-the-fly error correction. In one embodiment disclosed in that reference, syndromes were generated from the codeword using a generator polynomial. The generator polynomial was structured so that one syndrome directly yielded the error value of an error, and the error location was determined by comparing the error value with the value of the second syndrome multiplied by a field element.

Prior to comparing the error value with the value of the second syndrome multiplied by the field element, the second syndrome was premultiplied by a fixed premultiplier. In other words, not all the symbols in the codeword comprise data. The symbols of the codeword which do not comprise data are not important in data error correction Therefore, in the Johnson et al reference, the second syndrome was premultiplied by a field element having a set value so that the error correction system did not waste time looking for a data error in the symbol locations where no data was located.

SUMMARY OF THE INVENTION

However, the number of symbols in a codeword which contain data is directly related to the sector length of sectors on the magnetic disc This can vary from application to application and from disc drive to disc drive. For example, some sectors may be 4k bytes long or longer, while others are much shorter. Each sector may be partitioned into segments smaller than the size of a codeword If the premultiplier were constrained to premultiplying the second syndrome generated from the codeword by a field element having a value small enough to accommodate the longest segment length, then a system having a short segment length would waste an inordinate amount of time looking for data errors at symbol locations which do not hold data.

The present invention is an on-the-fly error correction apparatus where reading means are provided for reading an encoded codeword from data storage media. First and second syndromes are generated from the codeword wherein the first syndrome comprises an error value. Variable prescaling means is provided for prescaling the second syndrome by a variable prescaling field element. The error value is then compared with the prescaled second syndrome times a field element until the values are equal. The power of the field element when the values are equal comprises an error location corresponding to the error value. Correction means then corrects the incorrect symbol of the codeword using the error value as located by the error location.

DETAILED DESCRIPTION OF THE PREFERRED EMBODIMENTS

Figure 1:
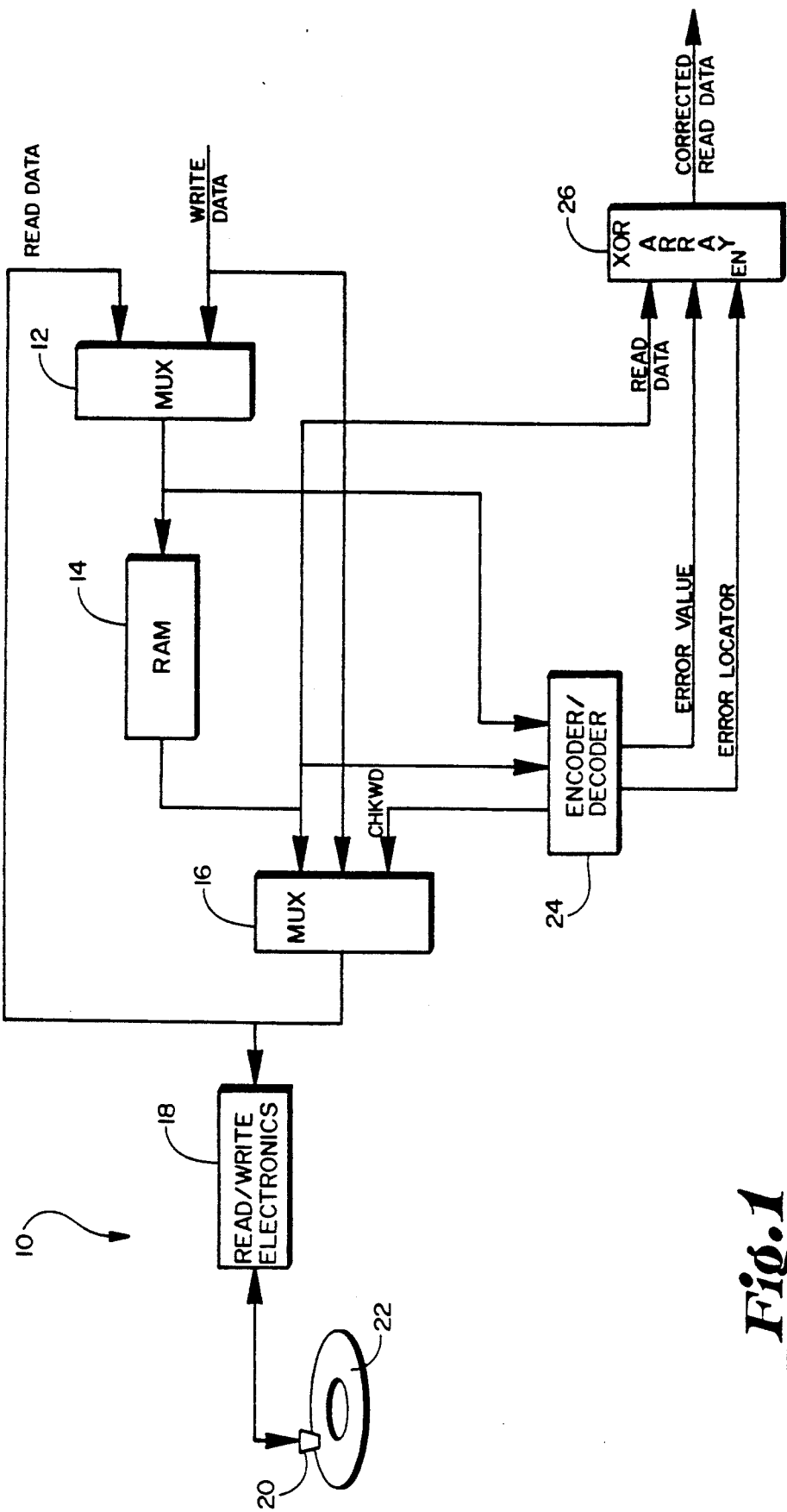
FIG. 1 is a block diagram of a preferred embodiment of an on-the-fly error correction system of the present invention.

FIG. 1 is a block diagram of error correction system 10. Error correction system 10 includes multiplexer 12, RAM 14, multiplexer 16, read/write electronics 18, read/write head 20, disc 22, encoder/decoder 24 and XOR array 26. Write data is provided from another source, for example an external controller (not shown) through multiplexer 12 to RAM 14 and encoder/decoder 24. Write data is also provided to multiplexer 16. Encoder/decoder 24 divides the write data, symbol by symbol, by a generator polynomial. When head 20 is appropriately located over disc 22 to perform a write operation, data symbols are clocked out of RAM 14 in a first-in-first-out (FIFO) manner, through multiplexer 16 to read/write electronics 18. Read/write electronics 18, in turn, provides the data to head 20 which writes the data to disc 22.

At the end of every data segment, which comprises a predetermined number of symbols, the remainder from division of the data symbols of the particular data segment by a generator polynomial is clocked out of encoder/decoder 24, through multiplexer 16, to read/write electronics 18. The remainder is appended to the data segment and inserted into the sequential write data operation for the sector of data to be recorded on disc 22. The remainder comprises, in the preferred embodiment where a single error correction code is employed, two checkword symbols.

Essentially, the reverse procedure is used during reading of data from disc 22. Read/write electronics 18 detects a sync mark denoting the beginning of a data sector on disc 22. This initializes read timing in system 10. The read data is provided, through multiplexer 12, to RAM 14 and encoder/decoder 24. Encoder/decoder 24 divides the codeword symbols, including the appended checkwords, by the generator polynomial. If no more than one symbol error occurred, the remainder (and the syndromes) after this division uniquely identifies both the location and value of an error in the codeword read from disc 22.

The error value from encoder/decoder 24, and the buffered read data segment clocked from RAM 14 are provided to XOR array 26. An Error Locator signal, based on the error location, from encoder/decoder 24 is provided to an enable input on XOR array 26. The read data is normally clocked through gate 26 unchanged, symbol by symbol. However, once the symbol location containing the error is reached, the Error Locator signal provided by encoder/decoder 24 enables XOR array 26 to correct the erroneous data symbol. The read data provided by RAM 14 is clocked through XOR array 26 and corrected using the error value provided by encoder/decoder 24. The corrected read data is then provided to, for example, an external interface or controller (not shown).

In this preferred embodiment, each symbol is 8 bits wide. Thus, the output of RAM 14 is 8 bits wide. Also, the remainder-checkwords after both encode and decode in encoder/decoder 24 comprise two 8 bit symbols.

In an alternative preferred embodiment, two codewords are interleaved. This permits detection of burst errors in two adjacent symbols without providing a two-error correcting code. This interleaved embodiment is described in more detail in the Johnson et. al. reference which has been previously incorporated by reference.

Figure 2:
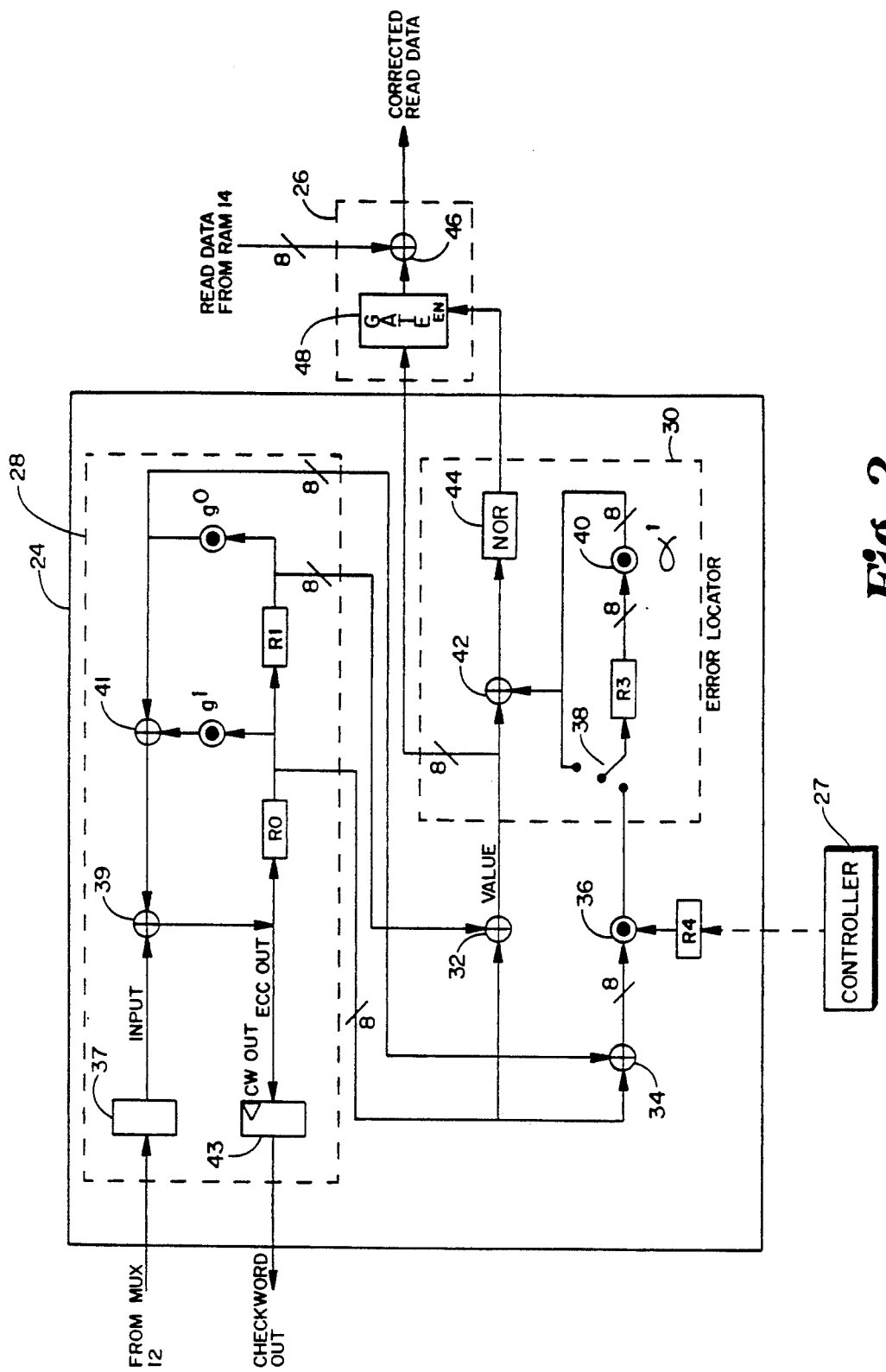
FIG. 2 is a more detailed block diagram of a portion of the system shown in FIG. 1.

FIG. 2 is a more detailed block diagram of encoder/decoder 24 and XOR array 26. Encoder/decoder 24 includes polynomial divider 28, error locator 30, XOR gates 32 and 34, variable premultiplier 36 and premultiplier register R4. Codewords read from disc 22 are supplied to generator polynomial divider 28 at input latch 37. Generator polynomial divider 28 has input XOR gate 39 coupled, at its input, to input latch 37. The other input of XOR gate 39 comes from the output of XOR gate 41. The output of XOR gate 39 is connected to the input of register R0 and checkword output latch 43. Register R0, in turn, has its output connected to XOR gate 32, Galois multiplier g1 and register R1. The output of Galois multiplier g1 is connected to an input of XOR gate 41. Register R1 is connected at its output, to Galois multiplier g0 which, in turn, has its output connected to the second input of XOR gate 41. As those skilled in the art appreciate this arrangement of elements provides Galois division by a generator polynomial of the form:

$$X^2 + g1X + g0 \qquad \text{Eq. 1}$$

$\alpha^i$ is an m-type filed element of $GF(2^8)$ modulo $P(X) = X^8 + X^4 + X^3 + X^2 + 1$ where the roots $\alpha^0$ and $\alpha^1$ of the generator polynominal are chosen such that syndrome $S_0$ directly yields the error value. In this arrangement, the roots $\alpha^0$ and $\alpha^1$, yield a generator polynominal:

$$G(X) = X^2 - \alpha^{25}X + \alpha^1 \qquad \text{Eq. 2}$$

and $g1 = \alpha^{25}$ which $= 00000011$ and $g0 = \alpha^1 = 00000010$.

All symbols of the codeword are clocked through generator polynomial divider 28. The sum of the contents of registers R0 and R1 represent the remainder divided by $X - \alpha^0$, which is syndrome $S_0$. The sum is formed by providing the outputs of registers R0 and R1 to XOR array 32, the output of which, $S_0$, is the error value.

Similarly, the syndrome $S_1$ may be used with the same generator polynomial to yield a value which, when applied to error locator 30, indicates an error location. The division of the remainder by $X - \alpha^1$ yields syndrome $S_1$. The coefficient of multiplier g0 is $\alpha^1$. Thus, the remainder divided by $X - \alpha^1$ happens to be the output of multiplier g0 summed with the output of register R0. This sum is provided by XOR array 34.

The error location is found using syndrome $S_1$ by comparing the product of syndrome $S_1$ and $\alpha^i$, where $i = 1, 2, \ldots 255$, to the error value. The product of $S_1$ and $\alpha^i$ may be determined by simply multiplying the syndrome $S_1$ by field element $\alpha^i$.

A codeword in $GF(2^8)$ has as many symbols as non-zero field elements (i.e., 255). In the preferred embodiment, however, the codeword may be shortened. In other words, some of the codeword symbols do not comprise data. Those symbol locations which do not comprise data are not important in data error correction.

The number of symbols which do not comprise data is typically a function of the sector length of the sectors on disc 22. In order to save time, and only check for errors where data is located, syndrome $S_1$ should be premultiplied, or prescaled, to the first possible data error location. This is achieved by multiplying syndrome $S_1$ by $\alpha^x$ where x corresponds to a value of the first location, where a data error could occur. Alternatively, syndrome $S_1$ could be multiplied by $\alpha^1 \times$ times.

Since the sector length on disc 22 can vary from application to application, or from disc drive to disc drive, variable premultiplier, or prescaler, 36 and premultiplier register R4 are provided. An external source, such as a controller 27, determines the number of symbol locations which do not comprise data. The controller can do this in a number of ways including reading that number from a storage device in the disc drive such as a ROM or the disc itself. Alternatively, the controller can, given the sector size, determine how many field locations do not comprise data. Based on that determination, the controller loads prescaler register R4 with a field element $\alpha^{x-1}$, where x is the number of locations which do not comprise field elements. Then, prescaler 36 prescales (or multiplies) syndrome $S_1$ by the value stored in register R4 and provides prescaled syndrome $S_1$ to error locator 30.

Error locator 30 includes switch 38, register R3, multiplier 40, XOR array 42 and NOR array 44. Prescaled syndrome $S_1$ is provided through switch 38 into register R3. Then, switch 38 closes on a multiplier loop which includes register R3 and $\alpha^1$ multiplier 40. The output of $\alpha^1$ multiplier 40 is provided to an input of XOR array 42. The second input to XOR array 42 is the error value provided from XOR array 32. If the inputs to XOR array 42 are identical (i.e., if the error value is identical to the scaled syndrome $S_1$) then the corresponding data symbol currently at the output of RAM 14 is the data symbol in error. Also, if the two inputs to XOR array 42 are equal, the output of XOR array 42 is 0. This is tested by NOR array 44, which goes high only when all inputs are 0. Therefore, the output of NOR array 44 is when the error value determined corresponds to the data currently being clocked out of RAM 14.

As each data symbol is about to be provided as output data, it is first provided to XOR array 26. XOR array 26 includes XOR gates 46 and gate 48. One input to XOR gate 46 is the read data from RAM 14. The other input is the gated error value from gate 48. The enable input of gate 48 is coupled to the output of NOR gate 44. When the symbols being clocked out do not contain errors, gate 48 is disabled. Thus, data is clocked out through XOR array 46 unchanged. However, when the symbol being clocked out corresponds to the error location, gate 48 is enabled. This allows the read data provided to XOR array 46 from RAM 14 to be corrected by the error value gated through gate 48 and provided to XOR array 46. Thus, the corrected read data is provided at an output from the error correction system 10.

Each time a new symbol is clocked out of RAM 14, register R3 is clocked to load a new power of syndrome $S_1$, thereby placing the next power of syndrome $S_1$ on the input to XOR array 42. This process continues until the entire codeword is processed.

The apparatus shown in FIG. 2 is for correcting a non-interleaved codeword only. If an interleaved codeword were being employed, two separate decoders could be used to correct each codeword, one for the odd portion of the interleaved codeword and one for the even portion. This method of decoding interleaved codewords is described more fully in the Johnson et. al. reference incorporated by reference above.

Figure 3:
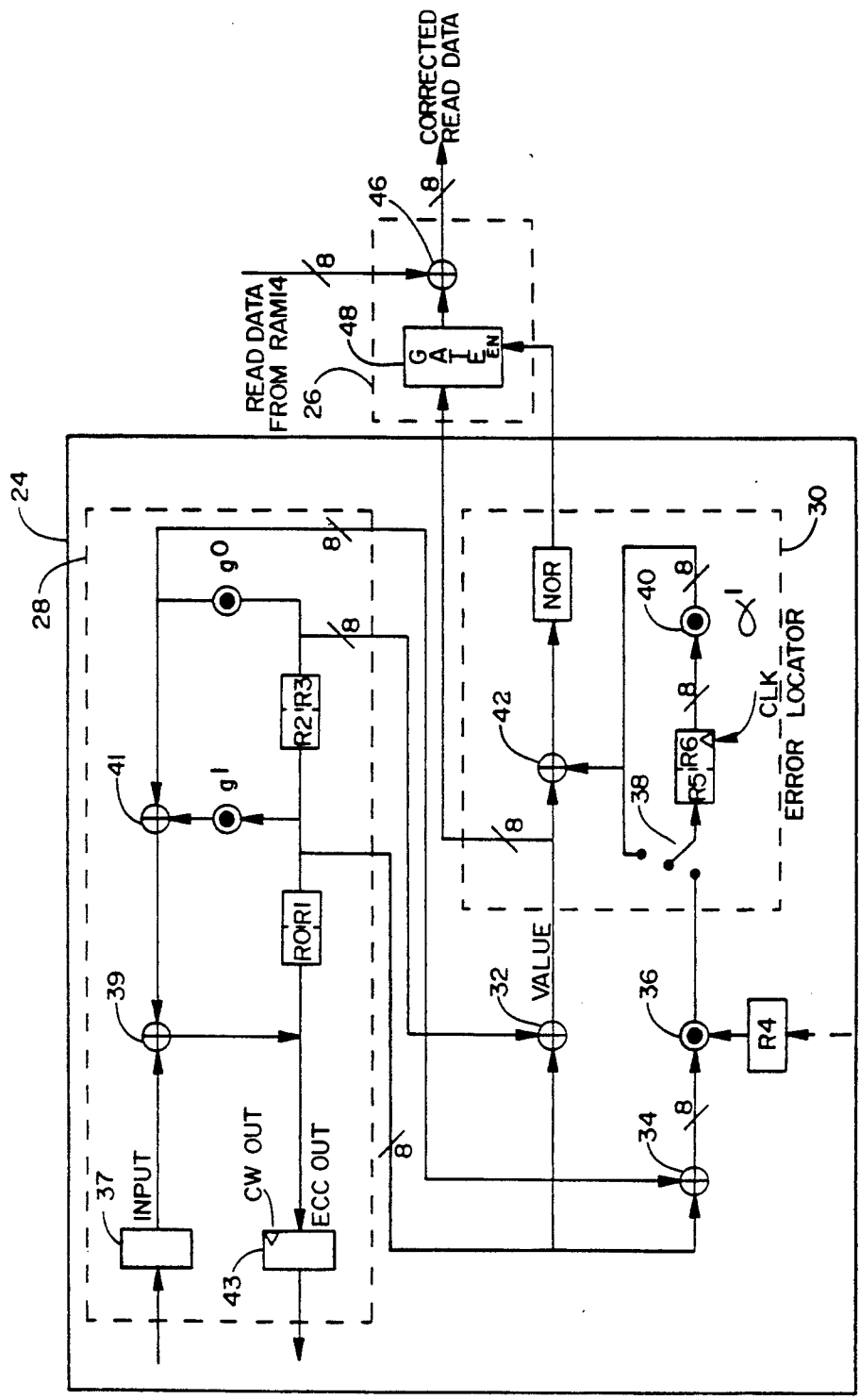
FIG. 3 is also a more detailed block diagram showing an alternative embodiment to that shown in FIG. 2.

FIG. 3 is another embodiment of encoder/decoder 24 of the present invention. The encoder/decoder shown in FIG. 3 operates similar to that shown in FIG. 2, and corresponding elements are similarly numbered. However, the encoder/decoder 50, shown in FIG. 3, is an alternative preferred encoder/decoder which provides for a less complex circuit to decode interleaved codewords.

In FIG. 3, register R0-R1 and register R2-R3 are shift registers which have two array cells. Essentially, at each clock pulse R0 copies the 8 bits on its input and R1 copies the 8 bits previously stored in R0 and places those 8 bits on its output. Register R2-R3 operates the same way. In this manner, both odd and even interleaved data segments or codewords, are input each clock pulse through input latch 38. However, they are effectively separated into two separate codewords by the shift registers R0-R1 and R2-R3. This arrangement reduces the need for duplicate Galois multipliers g0 and g1 and other circuitry previously required to be duplicated to decode interleaved codewords.

FIG. 3 also shows that register R3 of error locator 30 shown in FIG. 2 has been replaced with shift register R5-R6 which functions identically to shift registers R0-R1 and R2-R3. On alternate clock pulses, the even or odd error location is available at the output of NOR array 44, and the error value is available on the output of XOR array 32. If NOR array 44 indicates that the error location is the present symbol location, it enables gate 48 to pass the error value through to XOR array 46 which corrects the data symbol in error. However, if an error location is not present, gate 48 is not enabled and provides all zeros. Thus, the data from RAM 14 passes through XOR array 46 uncorrected.

CONCLUSION

The present invention provides an improved on-the-fly error correction system. By providing variable premultiplier 36 and register R4, which is loaded by a controller, the present system provides much more efficient error correction for codewords encoded on discs having variable sector lengths. In addition, the present system can be used in various disc drives and with various disc formats without modification. Thus, efficiency is greatly improved while complexity is diminished.

Although the present invention has been described with reference to preferred embodiments, workers skilled in the art will recognize that changes may be made in form and detail without departing from the spirit and scope of the invention.

What is claimed is:

1. An on-the-fly error correction apparatus, comprising:
   reading means for reading an encoded codeword from data storage media, the codeword encoded by means of an irreducible polynominal P(X) having a root $\alpha$ and a finite field of elements $\alpha^i$ modulo (P(X));
   a buffer, coupled to the reading means, for storing the codeword;
   divider means, coupled to the reading means and including first and second divider registers and first and second Galois field multipliers, for generating a first divider register value and a second divider register value from the codeword, for storing the first divider register value in the first divider register, and for storing the second divider register value in the second divider register;
   first syndrome generating means, coupled to the divider means, for summing the first divider register value and the second divider register value to obtain a first syndrome of the codeword the first syndrome comprising an error value;
   second syndrome generating means, coupled to the divider means, for summing the first divider register value and the output of the first Galois field multiplier to obtain a second syndrome of the codeword;
   variable prescaling means, coupled to the second syndrome generating means, for prescaling the second syndrome by prescaling field element $\alpha^x$ to produce a prescaled second syndrome value where $\alpha^x$ is variable;
   error locator means, coupled to the variable prescaling means and the first syndrome generating means, for locating an error location corresponding to the error value by comparing the error value with a multiplied value, wherein the multiplied value equals the prescaled second syndrome value times a field element $\alpha^1$, until the error value and the multiplied value are equal, the power of $\alpha^i$ when the values are equal comprising the error location corresponding to the error value; and correction means responsive to the buffer, the error locator means, and the first syndrome generating means, for correcting an incorrect symbol of the codeword using the error value as located by the error location determined by the error locator means.

2. The apparatus of claim 1 wherein the variable prescaling means comprises:

a prescaling storage device for storing $\alpha^x$; and a premultiplier coupled to the prescaling storage device and the second syndrome generating means and the error locator means to multiply the second syndrome by the field element $\alpha^x$ and to provide the prescaled second syndrome to the error locator means.

3. The apparatus of claim 2 and further comprising:

a controller coupled to the prescaling storage device for loading the prescaling storage device with $\alpha^x$.

4. The apparatus of claim 3 wherein the data storage media comprises:

a magnetic disc having a plurality of sectors, each sector having a sector length.

5. The apparatus of claim 4 wherein the controller comprises:

means for determining $\alpha^x$ based on the sector lengths of the sectors on the magnetic disc.

6. The apparatus of claim 1 wherein the buffer comprises random access memory (RAM).

7. An on-the-fly error correction apparatus, comprising:

reading means for reading an encoded codeword from data storage media, the codeword encoded by means of an irreducible polynominal P(X) having a root $\alpha$ and a finite field of elements $\alpha^i$ modulo P(X);

a buffer, coupled to the reading means, for storing the codeword;

divider means, coupled to the reading means and including first and second divider registers and first and second Galois field multipliers, for generating a first divider register value and a second divider register value from the codeword, for storing the first divider register value in the first divider register, and for storing the second divider register value in the second divider register;

first syndrome generating means, coupled to the divider means, for summing the first divider register value and the second divider register value to obtain a first syndrome of the codeword, the first syndrome comprising an error value;

second syndrome generating means, coupled to the divider means, for summing the first divider register value and the output of the first Galois field multiplier to obtain a second syndrome value of the codeword;

error locator means, coupled to the second syndrome generating means and the first syndrome generating means, for location an error location corresponding to the error value by comparing the error value with a multiplied value, wherein the multiplied value equals the second syndrome value times a field element $\alpha^1$, until the error value and the multiplied value are equal, the power of $\alpha^i$ when the values are equal comprising the error location corresponding to the error value; and correction means responsive to the buffer, the error locator means, and the first syndrome generating means, for correcting an incorrect symbol of the codeword using the error value as located by the error location determined by the error locator means.

8. The apparatus of claim 7 and further comprising:

variable prescaling means, coupled to the second syndrome generating means and the error locating means, for prescaling the second syndrome before the second syndrome is provided to the error locator means, wherein the second syndrome is prescaled by prescaling field element $\alpha^x$ and $\alpha^x$ is variable.

9. The apparatus of claim 8 wherein the variable prescaling means comprises:

a prescaling storage device for storing $\alpha^x$; and a premultiplier coupled to the prescaling storage device and the second syndrome generating means and the error locator means to multiply the second syndrome by the field element $\alpha^x$ and to provide the prescaled second syndrome to the error locator means.

10. The apparatus of claim 9 and further comprising:

a controller coupled to the prescaling storage device for loading the prescaling storage device with $\alpha^x$.

11. The apparatus of claim 10 wherein the data storage media comprises:

a magnetic disc having a plurality of sectors, each sector having a sector length.

12. The apparatus of claim 11 wherein the controller comprises:

means for determining $\alpha^x$ based on the sector lengths of the sectors on the magnetic disc.

* * * * *

UNITED STATES PATENT AND TRADEMARK OFFICE
CERTIFICATE OF CORRECTION

PATENT NO. : 5,243,604

DATED : September 7, 1993

INVENTOR(S) : KINHING P. TSANG, BRUCE E. JOHNSON

It is certified that error appears in the above-identified patent and that said Letters Patent is hereby corrected as shown below:

Col. 8, line 11, delete "location" (first occurrence), insert --locating--

Signed and Sealed this

Fifteenth Day of March, 1994

Attest:

BRUCE LEHMAN

*Attesting Officer*    *Commissioner of Patents and Trademarks*